(12) United States Patent
Nakashima et al.

(10) Patent No.: US 7,735,424 B2
(45) Date of Patent: Jun. 15, 2010

(54) OVERHEAD TRAVELING VEHICLE SYSTEM AND METHOD OF TRANSPORTING PROCESSING EQUIPMENT INTO, OR OUT OF POSITION AROUND THE OVERHEAD TRAVELING VEHICLE SYSTEM

(75) Inventors: Norio Nakashima, Inuyama (JP); Takuo Akiyama, Inuyama (JP); Yasuhisa Ito, Inuyama (JP); Eiji Wada, Inuyama (JP)

(73) Assignee: Murata Machinery, Ltd., Kyoto-shi (JP)

( * ) Notice: Subject to any disclaimer, the term of this patent is extended or adjusted under 35 U.S.C. 154(b) by 86 days.

(21) Appl. No.: 11/972,851

(22) Filed: Jan. 11, 2008

(65) Prior Publication Data
US 2008/0168920 A1  Jul. 17, 2008

(30) Foreign Application Priority Data
Jan. 12, 2007  (JP) ............................. 2007-004463

(51) Int. Cl.
*B61B 3/00* (2006.01)
(52) U.S. Cl. ........................................ 104/89; 414/267
(58) Field of Classification Search ................. 104/89
See application file for complete search history.

(56) References Cited
U.S. PATENT DOCUMENTS

| | | | | | |
|---|---|---|---|---|---|
| 5,623,808 | A | * | 4/1997 | Franklin et al. | ................ 53/399 |
| 6,183,184 | B1 | * | 2/2001 | Shiwaku | ...................... 414/281 |
| 6,989,597 | B2 | | 1/2006 | Fujino et al. | |
| 7,261,510 | B2 | * | 8/2007 | Motoori et al. | ............... 414/281 |
| 7,437,999 | B2 | * | 10/2008 | Nakao | ....................... 104/106 |
| 7,441,999 | B2 | * | 10/2008 | Nakao et al. | .............. 414/217.1 |
| 2004/0149672 | A1 | * | 8/2004 | Motoori et al. | .............. 212/332 |
| 2006/0222479 | A1 | * | 10/2006 | Shiwaku et al. | ............. 414/267 |
| 2006/0237525 | A1 | * | 10/2006 | Sone | .......................... 235/375 |
| 2008/0014061 | A1 | * | 1/2008 | Izumi | ......................... 414/281 |

FOREIGN PATENT DOCUMENTS

| | | |
|---|---|---|
| JP | 64-76803 A | 3/1989 |
| JP | 1-177531 U | 12/1989 |
| JP | 4-166555 A | 6/1992 |
| JP | 6-80710 U | 11/1994 |
| JP | 11-276271 A | 10/1999 |
| JP | 2003-210256 A | 7/2003 |
| JP | 2005-001886 A | 1/2005 |
| JP | 2005-144064 A | 6/2005 |
| JP | 2005-206371 A | 8/2005 |

OTHER PUBLICATIONS

Japanese Office Action dated Nov. 25, 2008, issued in corresponding Japanese Patent Application No. 2007-004463.
Decision of Refusal Dispatch date Mar. 10, 2009 issued in corresponding Japanese Patent Applicatin No. 2007-004463.

* cited by examiner

*Primary Examiner*—S. Joseph Morano
*Assistant Examiner*—Zachary Kuhfuss
(74) *Attorney, Agent, or Firm*—Westerman, Hattori, Daniels & Adrian, LLP

(57) ABSTRACT

An overhead traveling vehicle travels along a rail suspended from an upper position. Further, a buffer is suspended from an upper position. The buffer can be retracted from a storage space for an article, or the buffer is foldable compactly.

9 Claims, 10 Drawing Sheets

OVERHEAD TRAVELING VEHICLE SYSTEM AND METHOD OF TRANSPORTING PROCESSING EQUIPMENT INTO, OR OUT OF POSITION AROUND THE OVERHEAD TRAVELING VEHICLE SYSTEM

TECHNICAL FIELD

The present invention relates to a system including a buffer along a route of an overhead traveling vehicle. In particular, the present invention relates to a technique of preventing the buffer from obstructing operation of transporting processing equipment into, or out of a position in a space where an overhead traveling vehicle system is provided.

BACKGROUND ART

The applicant proposed to provide buffers below, and on sides of a travel route of overhead traveling vehicles (see Japanese Laid-Open Patent Publication No. 2005-206371). In this manner, it is possible to reduce the number of stockers for storing articles, and buffers near a port at the transportation destination become available. Thus, for example, an article is transported to a buffer near the port at the transportation destination beforehand, and when the port becomes empty, the article is transported into the empty port. Further, by using the additional buffers, it is possible to divide transportation operation to be shared by a plurality of overhead traveling vehicles.

However, the buffers may obstruct operation of transporting equipment such as processing equipment into, or out of a position around the buffers. The buffers below the route are provided at positions lower than the overhead traveling vehicles for avoiding interference with the articles being transported by the overhead traveling vehicles. Further, the height of the buffers provided on the sides of the route is substantially the same as the height of the articles being transported by the overhead traveling vehicles. At the time of replacing the equipment, the overhead traveling vehicles automatically move to suitable positions for not obstructing the replacement operation. However, the buffers occupy positions above the paths or positions above equipment, and thus, obstruct movement of the equipment.

SUMMARY OF THE INVENTION

An object of the present invention is to prevent obstruction by a buffer, e.g., at the time of moving equipment around an overhead traveling vehicle system.

Another object of the present invention is to store a buffer in a compact space.

Still another object of the present invention is to store a buffer in a compact space without bulging.

Still another object of the present invention is to make it possible to store, and recover a buffer easily.

According to the present invention, an overhead traveling vehicle system includes an overhead traveling vehicle traveling along a rail suspended from an upper position, and a buffer provided along the rail, and suspended from an upper position, for allowing an article to be placed on the buffer. The buffer can be retracted from a storage space of the article, or the buffer is foldable compactly.

According to another aspect of the present invention, a method of transporting processing equipment into, or out of a position around a rail suspended from an upper position in an overhead traveling vehicle system is provided. The overhead traveling vehicle system includes an overhead traveling vehicle traveling along the rail, and a buffer provided along the rail, and suspended from an upper position, for allowing an article to be placed on the buffer. The method includes the steps of:

retracting the buffer from a position of storing the article, or folding the buffer compactly to make an empty space at the storage position for the article; and transporting the processing equipment into, or out of a position around the rail through the empty space.

The buffer may be folded, slid, or rotated so as to retract from the storage space.

Preferably, the buffer can be stored by moving the buffer to a position above the buffer, and more preferably, the buffer can be stored by moving the buffer to a position vertically above the buffer.

Further, preferably, the buffer is a side buffer provided on a side of the rail, or an under buffer provided below the rail.

Preferably, when the buffer is stored, a member as part of the buffer is stored in the storage space. More preferably, the buffer has a table for placing the article on the table, and a vertical support for suspending the table from an upper position, and the table is stored in a storage space of the buffer provided for storing the article.

Preferably, the buffer has a table for placing the article on the table and a vertical support for suspending the table from an upper position, and the vertical support is foldable.

More preferably, the vertical support is foldable toward the table. Particularly preferably, the vertical support is foldable toward a position above the table.

Preferably, the buffer is formed by connecting a side buffer provided on a side of the rail and an under buffer provided below the rail, the side buffer can be stored by moving the side buffer to a position right above the side buffer, and the under buffer is rotatable about a portion connecting the under buffer and the side buffer, and the under buffer can be stored by rotating the upper buffer to a position above the under buffer.

Further, preferably, processing equipment is provided at a position around the route, and at the time of transporting the processing equipment into, or out of the position around the route, or at the time of moving the processing equipment, the buffer is retracted from the storage space of the article, or folded compactly.

Preferably, biasing means for biasing the buffer upwardly is provided.

In the present invention, at the time of transporting the processing equipment into, or out of the system, the buffer can be retracted or folded compactly. Thus, the change in the layout of a clean room or the like is not obstructed by the buffer.

Further, in the present invention, by retracting the buffer, or folding the buffer compactly, it is possible to make a space for allowing transportation of the processing equipment into, or out of the system. Thus, the change in the layout of the clean room or the like is not obstructed by the buffer.

When the buffer is stored, in the case where a member as part of the buffer is stored in the storage space for the buffer, it is possible to store the buffer compactly, and no additional space is required at the time of storage.

In the case where a table for placing the article and a vertical support suspended from an upper position are provided, and the vertical support is foldable toward the table, it is possible to store the buffer by folding the vertical support, and no bulging occur at the time of storage.

Further, in the case where biasing means for biasing the buffer upwardly is provided, it becomes easy to store the buffer in an upper position, and lower the stored buffer for recovery.

DETAILED DESCRIPTION OF THE INVENTION

Figure 1:
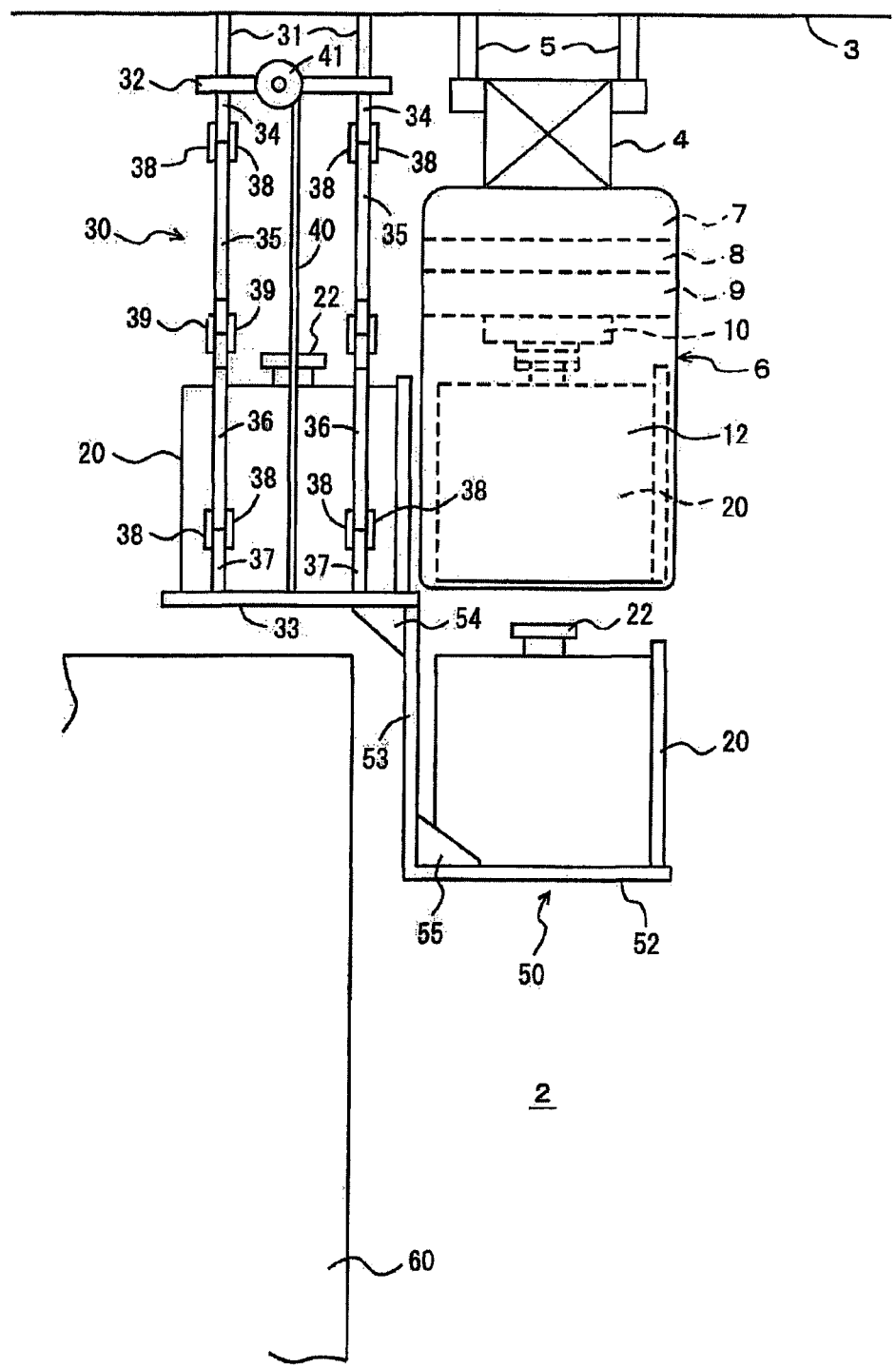
FIG. 1 is a front view showing an overhead traveling vehicle system according to an embodiment.
Figure 2:
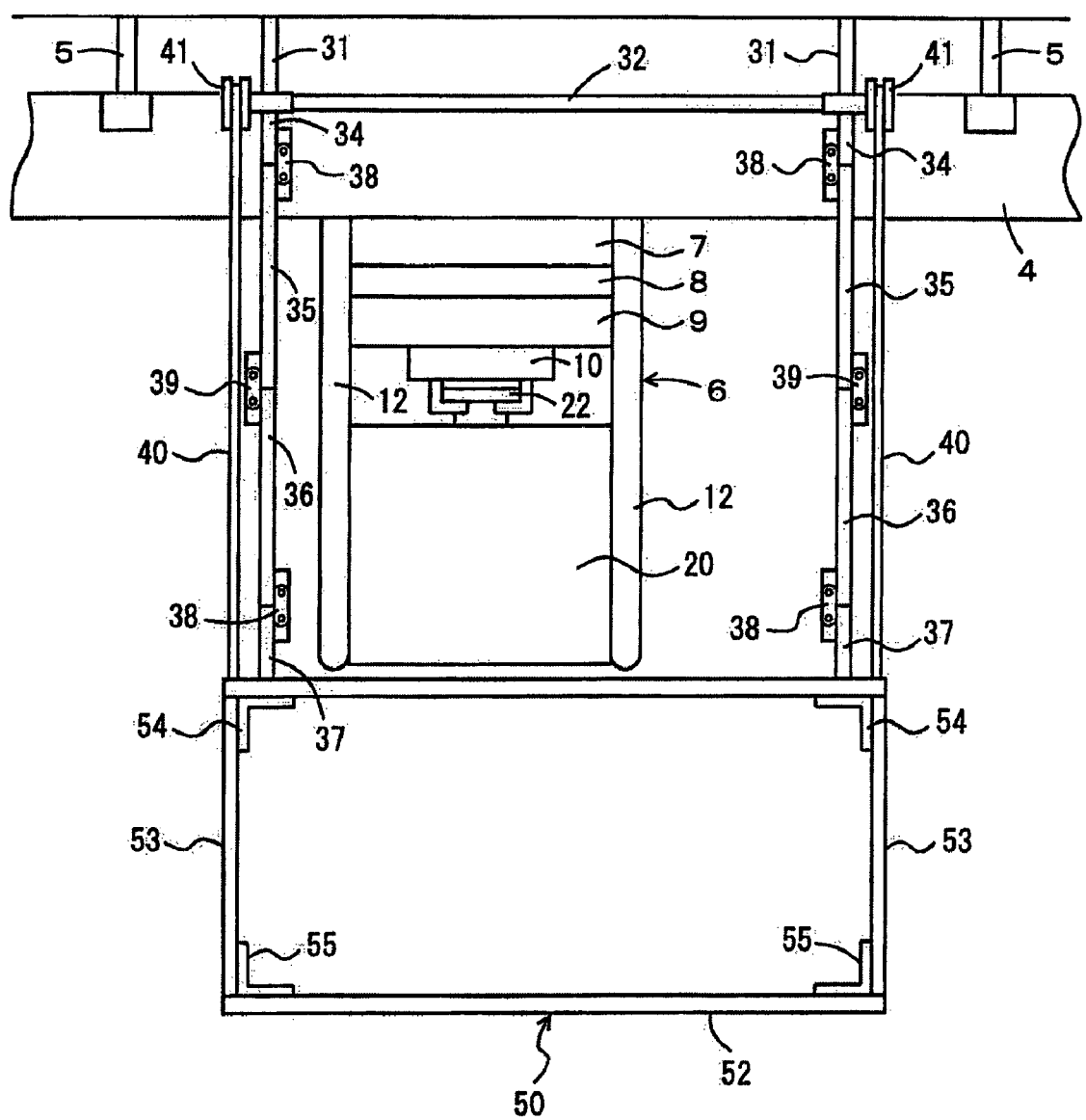
FIG. 2 is a side view showing main components of an overhead traveling vehicle system according to the embodiment.

FIGS. 1 to 8 show an embodiment and its modified embodiments. Unless specifically noted, the features of the modified embodiments are same as those of the embodiment of FIGS. 1 to 5. In the drawings, a reference numeral 2 denotes an overhead traveling vehicle system provided in a clean room or the like in a building. For example, articles such as semiconductor wafers or reticles are stored in cassettes 20, and transported. A reference numeral 3 denotes a ceiling of the building. A rail 4 for an overhead traveling vehicle 6 is suspended from an upper position using vertical supports 5. Likewise, a side buffer 30 is suspended from an upper position using vertical supports 31 or the like.

The overhead traveling vehicle 6 has a lateral drive 7, a θ drive 8, an elevation drive unit 9, an elevation frame 10, and a cover 12. The lateral drive 7 moves the θ drive 8, the elevation drive unit 9, and the elevation frame 10 horizontally in a direction perpendicular to a longitudinal direction of the rail 4. The θ drive 8 rotates the elevation drive unit 9 and the elevation frame 10 in a horizontal plane. The θ drive 8 may not be provided. The elevation drive unit 9 has a winding drum (not shown) for elevating and lowering the elevation frame 10. The cover 12 is provided on each of the front and rear sides of the overhead traveling vehicle 6 in the traveling direction for preventing falling of articles such as the cassette 20. The elevation frame 10 chucks a flange 22 of the cassette 20 for supporting the cassette 20.

A side buffer 30 is provided on a side of the rail 4, and supports an under buffer 50. The under buffer 50 is provided below the rail 4 at a position where no interference with the overhead traveling vehicle 6 occurs. The side buffer 30 includes an upper frame 32 and a support member 33. The cassette 20 is placed on the support member 33. A space on the support member 33 is used as a storage space of the article. Reference numerals 34 to 37 denote vertical supports. The vertical supports 35, 36 are foldable compactly into the storage space on the support member 33. For example, the vertical supports 35, 36 are folded in a direction parallel to the traveling direction of the rail 4. The vertical supports 34 to 37 are connected together by links 38, 39. Further, the vertical supports 31 and the vertical supports 34 may be the same members. A reference numeral 40 denotes a constant tension spring. The constant tension spring 40 applies a certain tension to the support member 33 upwardly. A reference numeral 41 denotes a winding unit. The tension of the constant tension spring 40 is constant regardless of the wound length.

The under buffer 50 has a support member 52 at a lower position for placing the cassette 20 on the support member 52. By a vertical support 53, the under buffer 50 is supported by the support member 33 of the side buffer 30. Reference numerals 54, 55 denote reinforcement pieces. The reinforcement pieces 54, 55 may not be provided.

A reference numeral 60 denotes processing equipment, e.g., for processing and inspecting semiconductors. The processing equipment is not limited to equipment for processing semiconductors. For example, the processing equipment 60 may represent various pieces of equipment provided in the building. The rail 4 and the under buffer 50 are provided on a passage where no processing equipment 60 is not present. The side buffer 30 is provided above the processing equipment 60 or the like, or on the passage.

Figure 3:
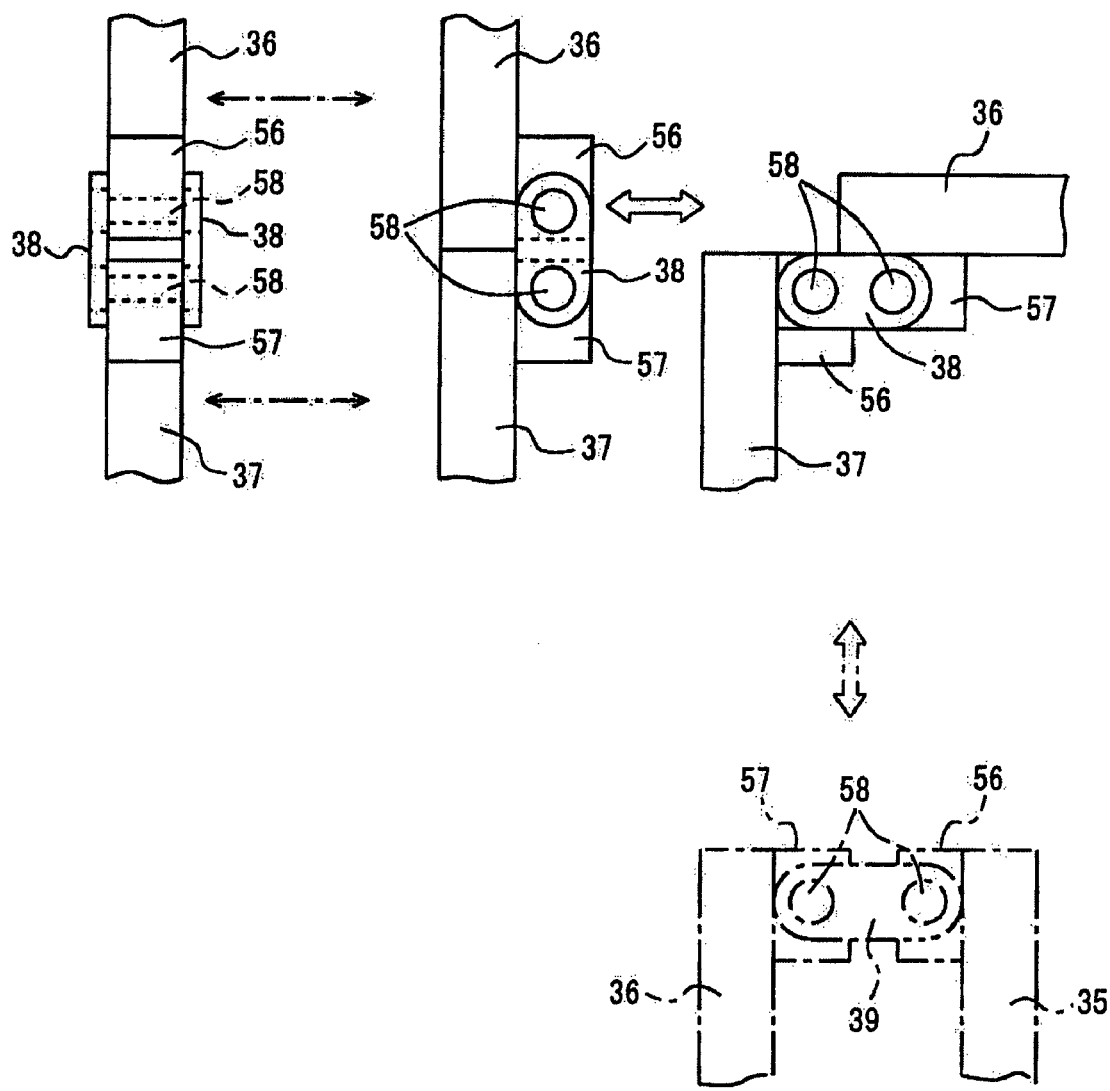
FIG. 3 is a view showing a joint of a vertical support of a buffer and its operation according to the embodiment.

FIG. 3 shows connection between the vertical supports, specifically, connection between the vertical supports 36, 37. The vertical supports 34, 35 are connected in the same manner. Reference numerals 56, 57 denote mounting members provided near joints of the vertical supports 36, 37. The vertical supports 36, 37 are connected by a link 38. Reference numerals 58 denotes pin. The upper left side of FIG. 3 shows front surfaces of the mounting members 56, 57, and the center of FIG. 3 shows side surfaces of the mounting members 56, 57. By folding the vertical supports 36, 37 from this state, the vertical supports 36, 37 are deformed as shown on the upper right side in FIG. 3, and it is possible to fold the vertical support 36 compactly. Further, in connecting the vertical supports 35, 36, orientations of the vertical supports 35, 36 are changed, e.g., at an angle of 180° through a link 39, as shown on the lower right side in FIG. 3.

Figure 4:
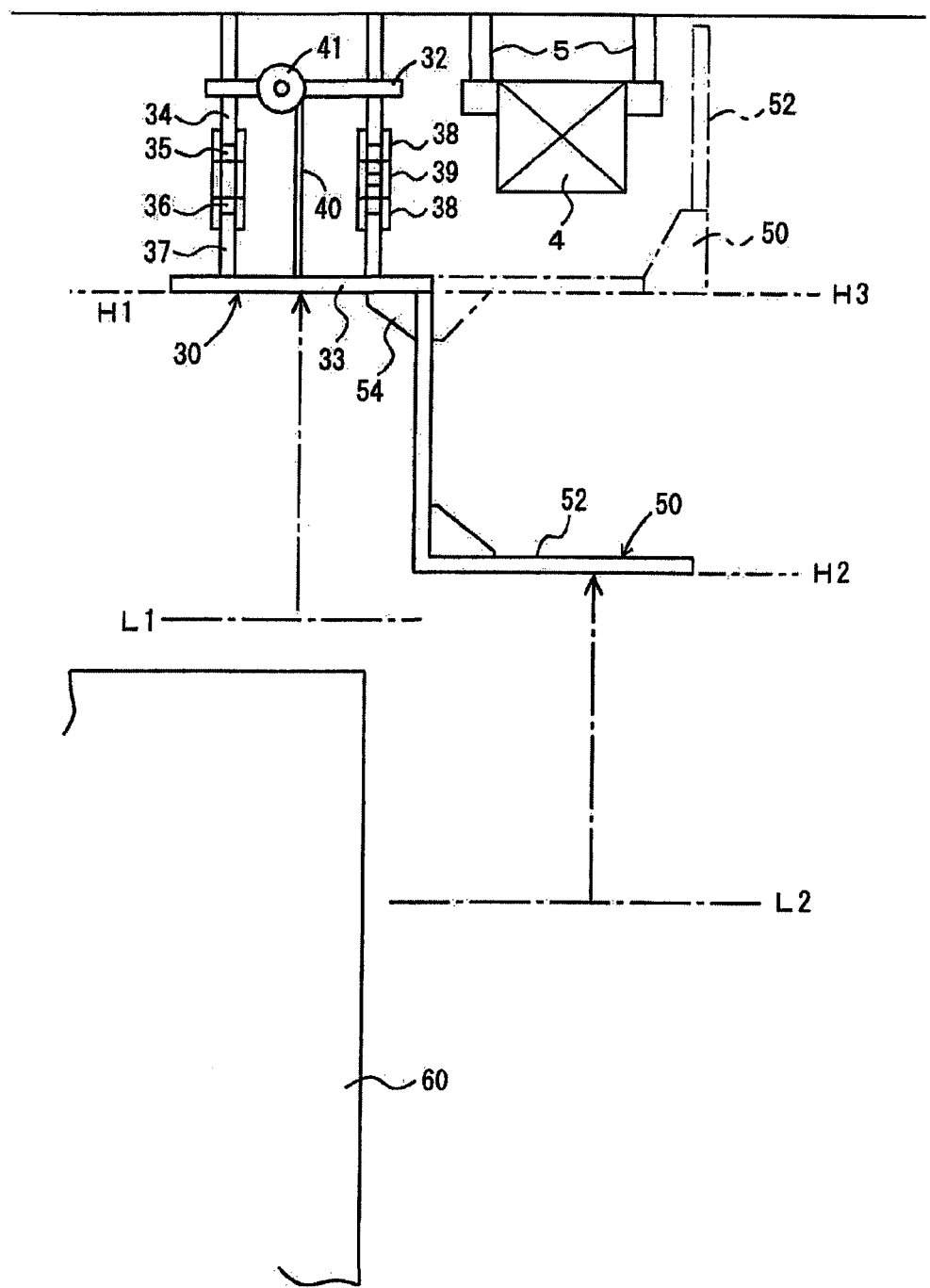
FIG. 4 is a front view showing an overhead traveling vehicle system in a state where a side buffer is folded compactly, according to the embodiment.
Figure 5:
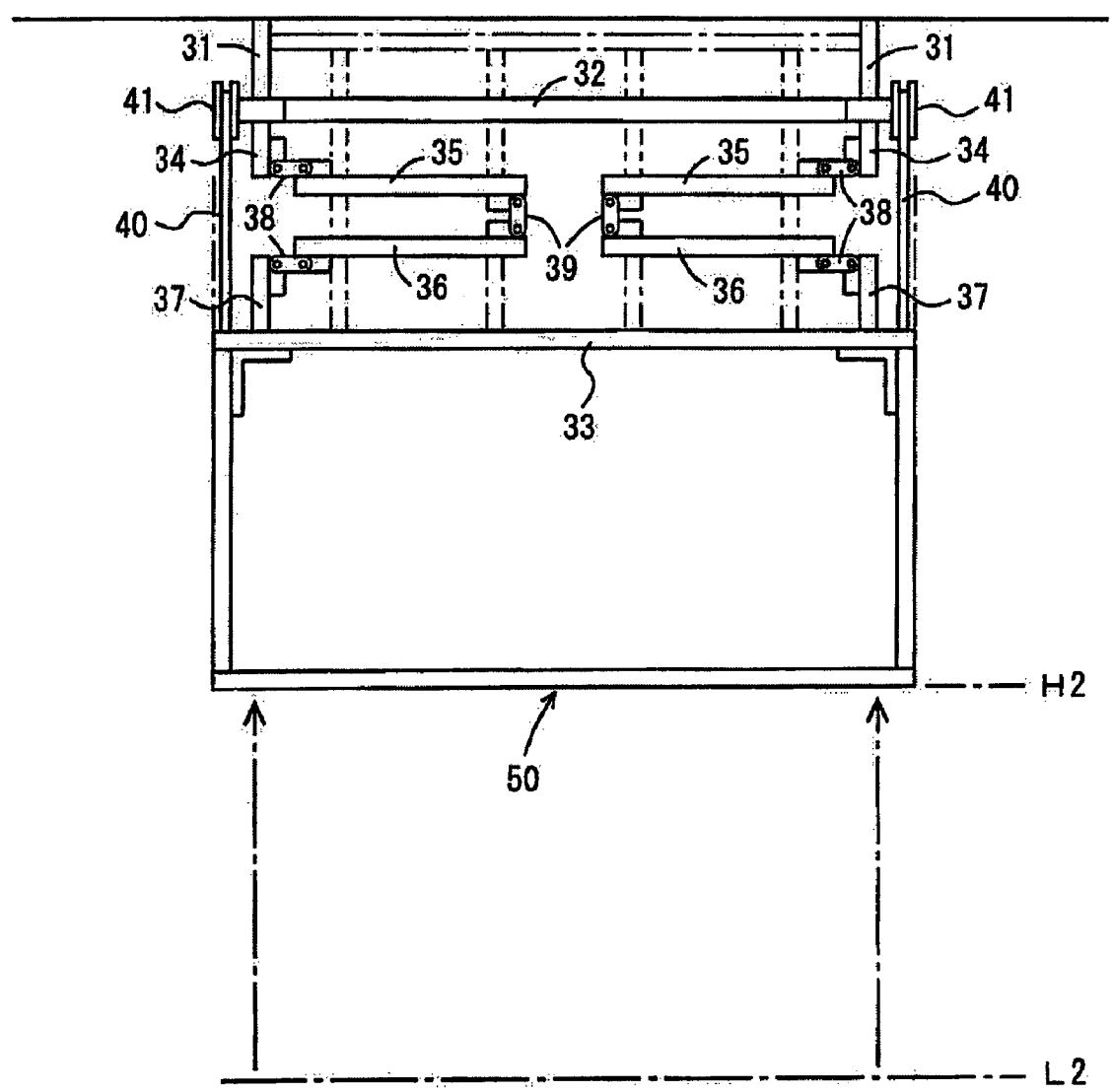
FIG. 5 is a side view showing main components of the overhead traveling vehicle system in the state where the side buffer is folded compactly, according to the embodiment.

FIGS. 4 and 5 show a state in which the side buffer 30 and the under buffer 50 are folded compactly. A reference numeral L1 denotes the height at the bottom of the side buffer 30 in the normal state, and a reference numeral L2 denotes the height at the bottom of the under buffer 50 in the normal state. A reference numeral H1 denotes the height at the bottom of the side buffer 30 in the state where the side buffer 30 is folded compactly. A reference numeral H2 denotes the height at the bottom of the under buffer 50 in the state where the lower buffer 50 is folded compactly. From the state of FIG. 4, by further rotating the under buffer 50 at an angle of 90° to orient the support member 52 vertically, it is possible to elevate the height of the under buffer 50 to the height H3.

In this state, the vertical supports 35, 36 are folded compactly inside an upper portion of the storage space in the side buffer 30, and do not bulge outwardly from the space which was originally occupied by the side buffer 30. After folding the vertical supports 35, 36 compactly, the vertical supports 35, 36 are stored in the storage space on the support member 33 which was originally used for the cassette 20.

Since the support member 33 of the side buffer 30 is biased upwardly by the constant tension spring 40, it is possible to elevate the support member 33 with a small force. Then, after the support member 33 is elevated to a predetermined position, using a key (not shown) or the like, the side buffer 30 is fixed at this position. Alternatively, an engagement member and an engaged member that engage each other when the vertical supports 35, 36 are folded at a predetermined angle may be provided. In this case, when the support member 33 is elevated to a predetermined height, the vertical supports 35, 36 engage with each other.

When the side buffer 30 and the under buffer 50 are stored in the upper space, the height of the space available for the passage is elevated to the height level H2, and it becomes easy to transport the processing equipment 60 or the like into, or out of the system. If it is necessary to transport the processing equipment which is higher than that of FIG. 4 into, or out of the system, the under buffer 50 should be retracted to the height level H3. at the time of recovering (returning) the buffers 30, 50 to their original positions after transportation of the processing equipment 60 or the like, the vertical supports 35, 36 should be disengaged from each other, and the support member 33 should be lowered. At the time of lowering the support member 33, since the gravity of the buffers 30, 50 is partially supported by the constant tension spring 40, it is possible to lower the support member 33 easily. When the support member 33 is lowered to the height level L1, by the difference between the own weight of the side buffer 30 or the like and the tension of the constant tension spring 40, the orientation and the position of the side buffer 30 are fixed. In the case of further reliably fixing the side buffer 30, the vertical supports 34, 35, the vertical supports 35, 36, and the vertical supports 36, 37 should be fixed together using a key or engagement means (not shown).

Figure 6:
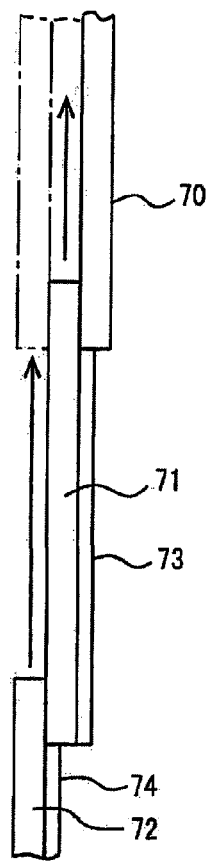
FIG. 6 is a view showing a mechanism of extending and contracting a vertical support of a buffer according to a modified embodiment.

FIG. 6 shows a first modified embodiment. Reference numerals 70 to 72 denote vertical supports of side buffers. The vertical support 71 is elevated as shown by a chain line in FIG. 6, and overlapped on the vertical support 70. Likewise, the vertical support 72 is overlapped on the vertical support 70 as shown by a chain line in FIG. 6. Reference numerals 73, 74 denote guides for guiding vertical movement of the vertical supports 71, 72. In this manner, without bulging, the side buffer is stored in an upper position to avoid obstruction of transportation of the processing equipment or the like into, or out of the system.

Figure 7:
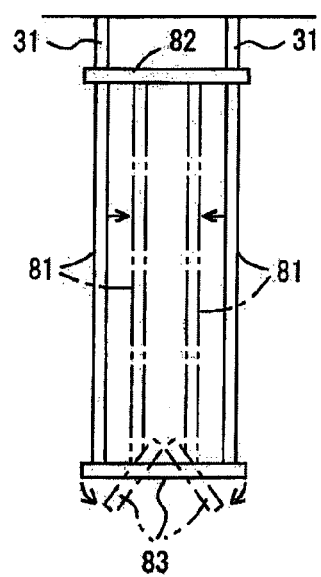
FIG. 7 is a view schematically showing a manner of folding a buffer compactly according a second modified embodiment.

FIG. 7 is a view showing a side buffer according to a second modified embodiment. Reference numerals 81 denote vertical supports, a reference numeral 82 denotes an upper frame, and a reference numeral 83 denotes a lower frame. The vertical supports 81 are slidable along the upper frame 82. Further, the lower frame 83 includes a left part and a right part coupled at a central position by a hinge such that the lower frame 83 can be folded compactly as shown by a chain line in FIG. 7. By sliding the vertical supports 81 toward the center of the lower frame 83, the lower frame 83 is folded compactly, and the space occupied by the side buffer is reduced.

Figure 8:
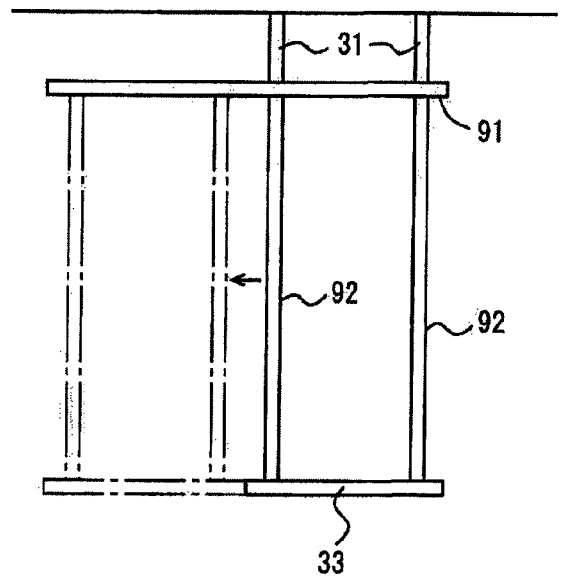
FIG. 8 is a view showing retraction of a buffer according to a third modified embodiment.
Figure 9:
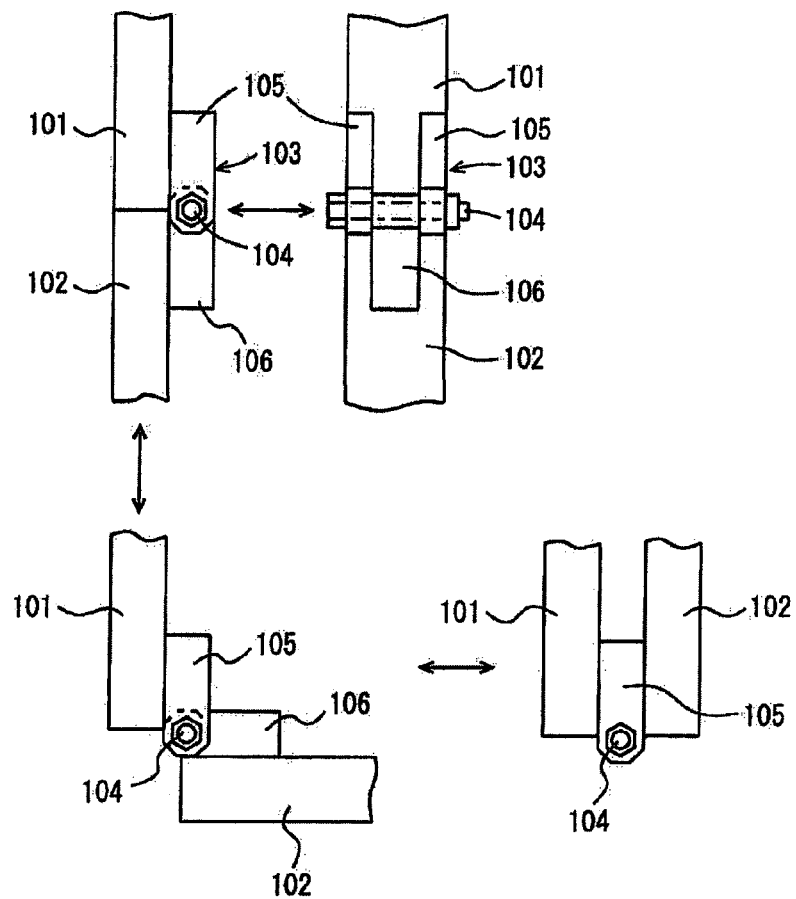
FIG. 9 is a view showing a joint according to a modified embodiment, the upper left side illustrating a left side surface, the upper right side illustrating a front surface, the lower left side illustrating a state in which the joint is folded at an angle of 90°, and the lower right side illustrating a state in which the joint is folded at an angle of 180°.
Figure 10:
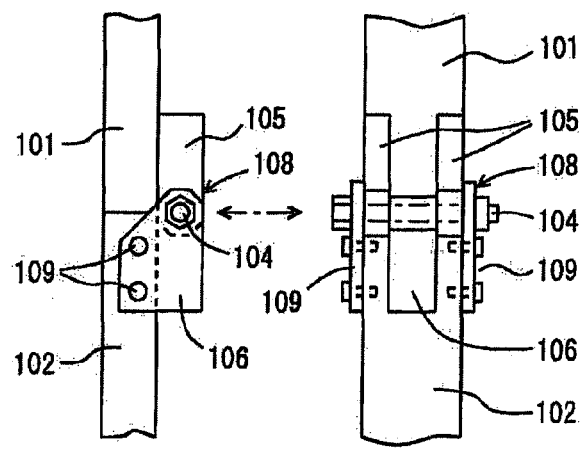
FIG. 10 is a view showing a joint according to a second modified embodiment, the left side illustrating a left side surface, and the right side illustrating a front surface.

FIG. 8 shows a third embodiment. A reference numeral 91 denotes a new upper frame. Reference numerals 92 denote new vertical supports. The vertical supports 92 are slidable relative to the upper frame 91. As shown by a position of a chain line in FIG. 8, by sliding the vertical supports 92, it is possible to make an open space for transportation of the processing equipment or the like.

Types and structure of the overhead traveling vehicle can be adopted arbitrarily. Further, in the embodiment, though the under buffer 50 is supported by the side buffer 30, the under buffer 50 may be supported by a vertical support which can be folded compactly from the ceiling 3 or the rail 4, and the under buffer 50 may be folded in the same manner as in the case of the side buffer 30. In this case, the side buffer 30 may not be provided, and the lateral drive 7 may not be provided in the overhead traveling vehicle.

FIGS. 9-14 show various modified embodiments. Reference numerals 101 and 102 in FIGS. 9 to 11 denote vertical supports for supporting the under buffer or supporting the side buffer. A reference numeral 103 denotes a joint, and a reference numeral 104 denotes a shaft of the joint 103. Reference numerals 105, 106 denote mounting pieces mounted to the vertical supports 101, 102. In a joint 108 shown in FIG. 8, pins 109 are used for improving the strength for mounting to the vertical support 102.

Figure 11:
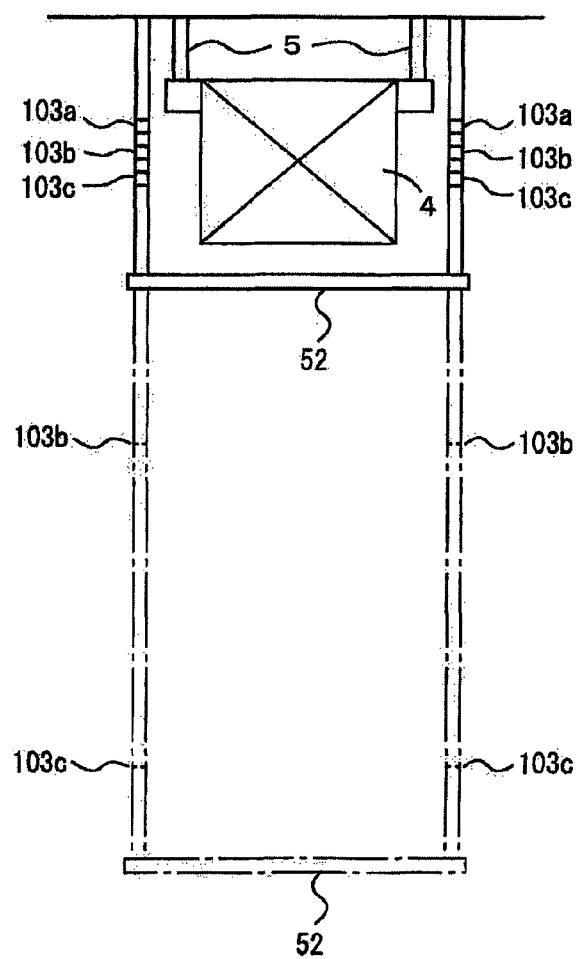
FIG. 11 is a view showing an under buffer using a joint according to a modified embodiment, where an under buffer stored in an upper position is denoted by a solid line, and an under buffer lowered downwardly is denoted by a chain line.

In the case where the joints 103, 108 are foldable at an angle of 90° or 180° it is possible to fold the vertical supports 101, 102 at an angle of 90° or 180°. As shown in FIG. 11, if the vertical support of the buffer 52 has, e.g., three joints 103a, 103b, 103c, it is possible to store the buffer 52 at an upper position.

Figure 12:
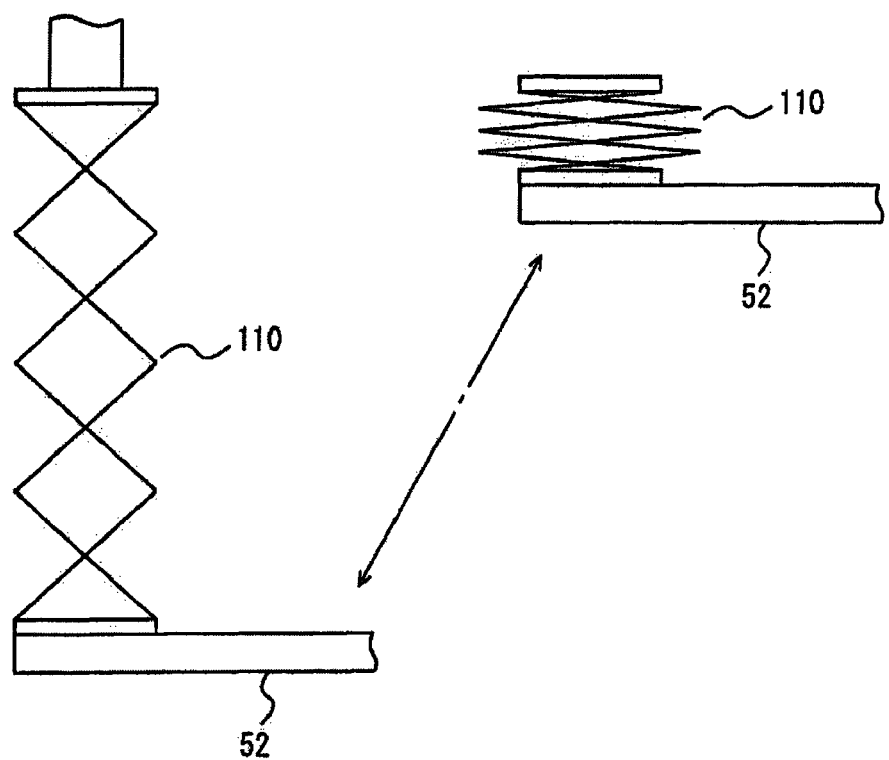
FIG. 12 is a view showing a mechanism of expanding and contracting a vertical support using an accordion.

FIG. 12 shows an example in which the buffer is elevated and lowered using an accordion 110. The state in which the accordion 110 is expanded, and the buffer 52 is lowered is shown on the left side, and the state the accordion is compressed, and the buffer 52 is stored is shown on the right side.

Figure 13:
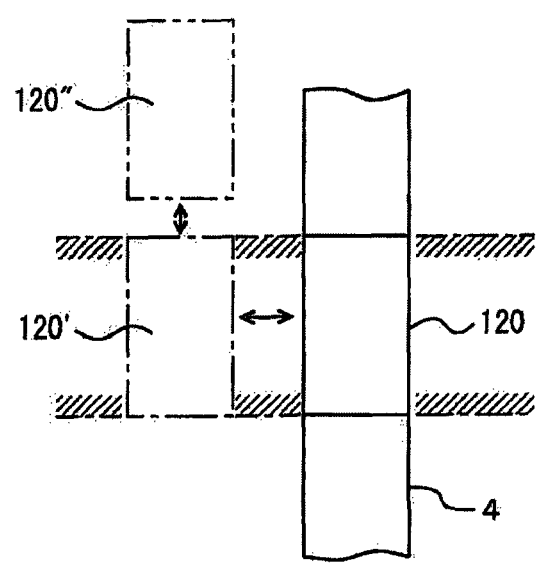
FIG. 13 is a plan view showing main components in a modified embodiment, where sliding of a buffer toward a side of a travel rail and sliding of the buffer in a direction along the travel rail are combined.

FIG. 13 is an example of sliding a buffer 120 at the right angle with respect to the travel rail 4, and then, sliding the buffer 120 in parallel with the travel rail 4. In the example, is possible to make an empty space in the passage for the length corresponding to the buffer 120. The buffer after sliding at the right angle relative to the travel rail 4 is denoted by a reference numeral 120', and the buffer after further sliding in parallel with the travel rail 4 is denoted by a reference numeral 120".

Figure 14:
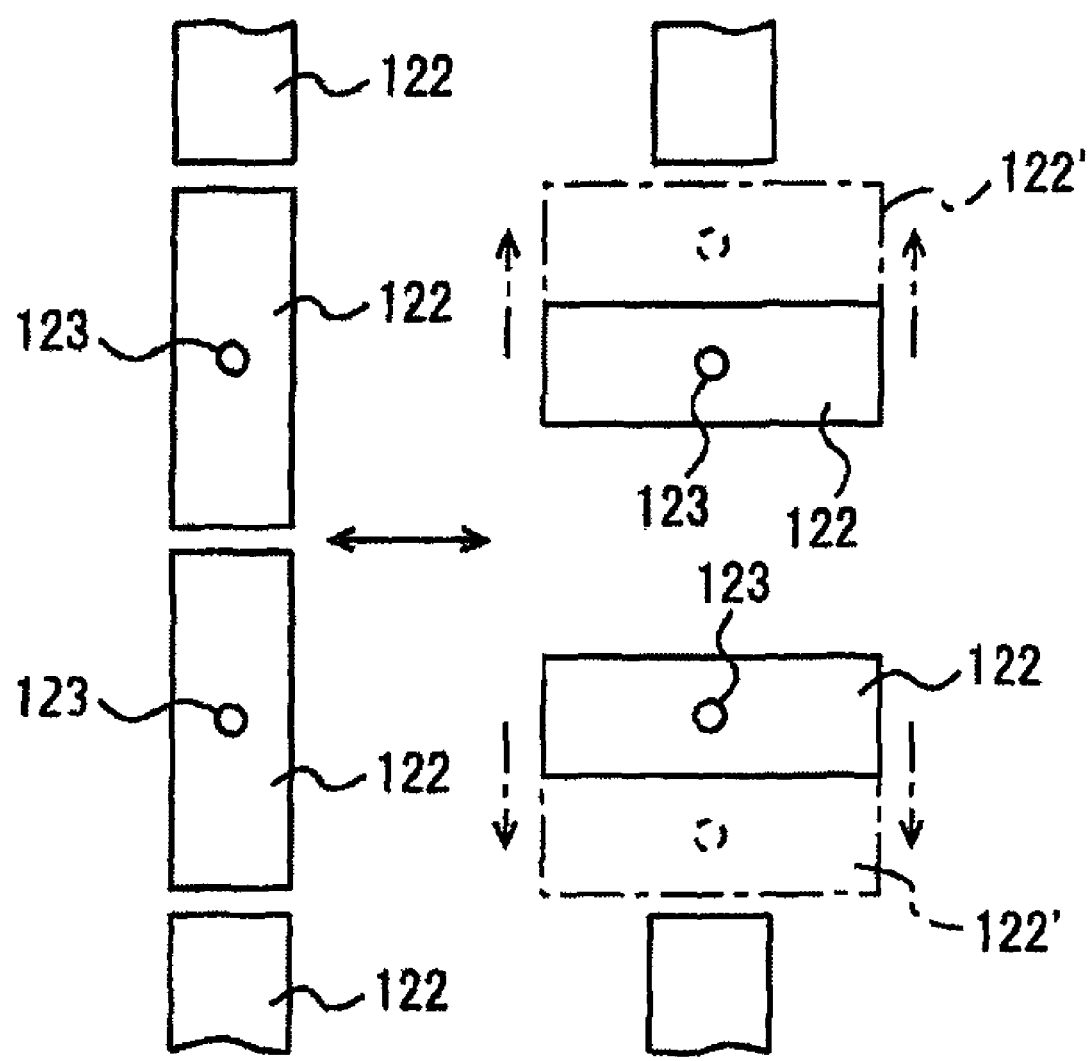
FIG. 14 is a plan view showing man components in a modified embodiment, where rotation and sliding of a buffer are used.

FIG. 14 shows an example of rotating the buffer 122 at an angle of 90° about a shaft 123. The state in which the buffer 122 is used is shown in a plan view, on the left side of FIG. 14, and the state after rotation of the buffer 122 at the angle of 90° about the shaft 123 is shown on the right side of FIG. 14. In this manner, a passage can be provided in a gap of the buffer. When the buffer is in the state denoted by a reference numeral 122' by further sliding along the traveling direction of the overhead traveling vehicle, it is possible to make a wide space in the passage.

In the embodiment, the following advantages are obtained.

(1) It is possible to store the side buffer 30 by upwardly moving the side buffer 30 to the upper position.

(2) The stored side buffer 30 is placed within the space which was occupied by the side buffer 30 in the normal state, without bulging.

(3) It is possible to store the under buffer 50 by upwardly moving the under buffer 50 to the upper position, in combination with storage of the side buffer 30.

(4) The gravity applied to the support member 33 or the like can be reduced using the constant tension spring 40. Therefore, it is possible to elevate and lower the side buffer 30 and the under buffer 50 easily. Thus, it is possible to store the buffers 30, 50 easily, and recover (return) the buffers 30, 50 to their original positions easily.

The invention claimed is:

1. A method of transporting processing equipment into or out of a position around a rail suspended from a ceiling in an overhead traveling vehicle system, the overhead traveling vehicle system including an overhead traveling vehicle traveling along the rail, and a buffer provided along the rail and suspended from the ceiling and forming a storage position for storing an article, comprising the steps of:

retracting the buffer from the storage position, or folding the buffer compactly, thereby forming an empty space at the storage position; and transporting the processing equipment into or out of the position around the rail through the empty space, wherein said retracting includes moving said buffer vertically.

2. The method according to claim 1, wherein the buffer includes a support member forming the storage position and a vertical support for suspending the support member from the ceiling, and wherein said retracting includes folding said vertical support.

3. The method according to claim 2, wherein the vertical support has an accordion shape, and wherein said retracting includes collapsing the accordion shape of the vertical support.

4. The method according to claim 2, wherein said retracting includes folding the vertical support toward a position above the support member.

5. An overhead traveling vehicle system, comprising:

a rail suspended from a ceiling, an overhead traveling vehicle traveling along the rail, and a buffer provided along the rail and suspended from the ceiling, said buffer forming a storage position for storing an article, and a means for retracting the buffer from the storage position or for folding the buffer compactly, wherein the buffer is vertically movable, wherein the buffer includes a support member forming the storage position and a vertical support for suspending the support member from the ceiling, and wherein the vertical support is foldable.

6. The overhead traveling vehicle system according to claim 5, wherein the vertical support has an accordion shape.

7. The overhead traveling vehicle system according to claim 5, wherein the vertical support is foldable toward a position above the support member.

8. The overhead traveling vehicle system according to claim 5, wherein the buffer includes a side buffer provided on a side of the rail and an under buffer provided below the rail;

wherein the side buffer can be stored by moving the side buffer vertically; and wherein the under buffer is rotatable about a portion connecting the under buffer and the side buffer, and the under buffer can be stored by rotating said under buffer relative to said side buffer.

9. The overhead traveling vehicle system according to claim 5, further comprising biasing means for biasing the buffer upwardly.

* * * * *